(12) United States Patent
Camp et al.

(10) Patent No.: US 10,640,895 B1
(45) Date of Patent: May 5, 2020

(54) ITEMS WITH WIRE ACTUATORS

(71) Applicant: Apple Inc., Cupertino, CA (US)

(72) Inventors: John S. Camp, San Francisco, CA (US); Robert L. Coish, Mountain View, CA (US); Kyle J. Nekimken, San Jose, CA (US); John A. Porcella, Morgan Hill, CA (US); Michael A. Damianakis, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 398 days.

(21) Appl. No.: 15/448,832

(22) Filed: Mar. 3, 2017

Related U.S. Application Data

(60) Provisional application No. 62/311,600, filed on Mar. 22, 2016.

(51) Int. Cl.

| | | |
|---|---|---|
| *D04B 1/14* | (2006.01) | |
| *H01H 13/85* | (2006.01) | |
| *H01F 7/06* | (2006.01) | |
| *H01F 7/20* | (2006.01) | |
| *H03K 17/96* | (2006.01) | |
| *H03K 17/94* | (2006.01) | |
| *A41D 1/00* | (2018.01) | |
| *A41D 31/02* | (2019.01) | |
| *D03D 15/00* | (2006.01) | |
| *A47C 5/00* | (2006.01) | |

(52) U.S. Cl.
CPC .............. *D04B 1/14* (2013.01); *A41D 1/005* (2013.01); *A41D 31/02* (2013.01); *A47C 5/00* (2013.01); *D03D 15/00* (2013.01); *H01F 7/064* (2013.01); *H01F 7/20* (2013.01); *H01H 13/85* (2013.01); *H03K 17/941* (2013.01); *H03K 17/962* (2013.01); *H03K 17/9625* (2013.01)

(58) Field of Classification Search
CPC .. D04B 1/14; H01F 7/20; H01F 7/064; H01H 13/85; A41D 1/005; A41D 31/02; A47C 5/00; H03K 17/9625; H03K 17/941; H03K 17/962; D03D 15/00
USPC ........................................................ 361/139
See application file for complete search history.

(56) References Cited

U.S. PATENT DOCUMENTS

| | | |
|---|---|---|
| 5,349,964 A | 9/1994 | Imran et al. |
| 6,705,868 B1 | 3/2004 | Schleppenbach |
| 7,876,199 B2 | 1/2011 | Caine |
| 8,368,566 B2 | 2/2013 | Higa |

(Continued)

*Primary Examiner* — Dharti H Patel
(74) *Attorney, Agent, or Firm* — Treyz Law Group, P.C.; G. Victor Treyz; Matthew R. Williams

(57) ABSTRACT

An item such as a fabric-based item or other item may have one or more actuators. An actuator may have a conductive strand of material. A control circuit may supply a current to the conductive strand that induces a length change in the conductive strand due to ohmic heating and associated thermal expansion effects. The control circuit may be used to activate the actuator in response to user input that is supplied to an associated input device such as a switch, capacitive sensor, force sensor, light-based sensor, or other input component. The fabric-based item may include fabric such as woven fabric or knit fabric. Strands of conductive material may serve as signals paths for supplying current to conductive strands in actuators. Magnetic-field-based actuators may be formed by coiling conductive strands around tubular support structures such as piping in fabric-based items.

24 Claims, 15 Drawing Sheets

(56) References Cited

U.S. PATENT DOCUMENTS

| | | | |
|---|---|---|---|
| 8,866,641 B2 | 10/2014 | Caine et al. | |
| 10,191,550 B1* | 1/2019 | Nussbaum | G06F 3/016 |
| 2001/0019050 A1* | 9/2001 | Rock | D04B 1/04 |
| | | | 219/545 |
| 2015/0083705 A1* | 3/2015 | Cronn | H05B 3/347 |
| | | | 219/211 |
| 2016/0038083 A1 | 2/2016 | Ding et al. | |
| 2016/0063826 A1 | 3/2016 | Morrell et al. | |

\* cited by examiner

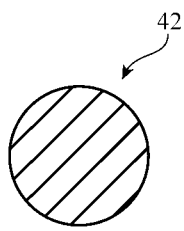 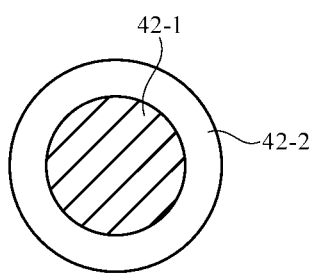 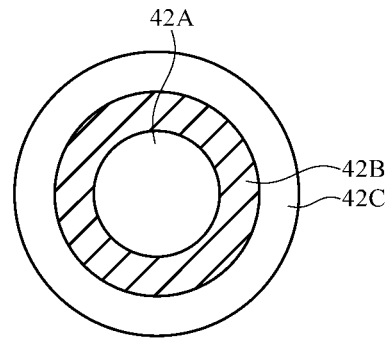
*FIG. 5*          *FIG. 6*          *FIG. 7*

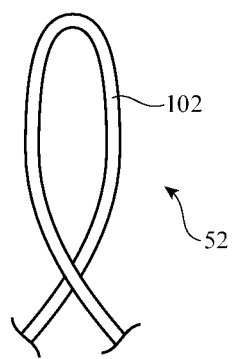 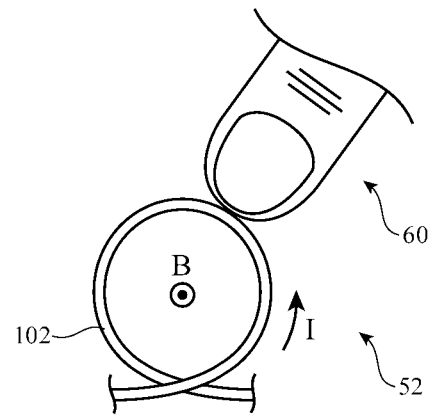
*FIG. 17* *FIG. 18*

ITEMS WITH WIRE ACTUATORS

This application claims the benefit of provisional patent application No. 62/311,600, filed Mar. 22, 2016, which is hereby incorporated by reference herein in its entirety.

FIELD

This relates generally to actuators and, more particularly, to actuators for items such as items with fabric.

BACKGROUND

Cellular telephones and other devices sometimes include vibrating actuators. An actuator formed from a motor with a rotating eccentric mass may be used, for example, to provide a vibrating alert when an incoming telephone call is received. Actuators may also be used to provide haptic feedback for displays, touch pads, or other input devices.

If care is not taken, actuators may be too bulky, may consume more power than desired, or may not be compatible with the structures used in forming an item of interest.

SUMMARY

An item such as a fabric-based item or other item may have one or more actuators. The actuators may be used to provide a user of an item with haptic output. For example, in an item such as a fabric covered keyboard, keys may be provided with actuators so that haptic feedback may be provided as a user presses the keys.

An actuator may have a conductive strand of material. When it is desired to activate the actuator, a control circuit may supply a current to the conductive strand. The current may heat the conductive strand through ohmic heating and may thereby increase the length of the conductive strand due to thermal expansion effects. When the current is removed, the conductive strand may rapidly cool and contract. Changes in the length of the conductive strand may supply haptic output.

A control circuit in an item may be used to activate an actuator in response to user input that is supplied to an associated input device such as a switch, capacitive sensor, force sensor, light-based sensor, or other input component that is aligned with the actuator. The fabric-based item may include fabric such as woven fabric or knit fabric. Strands of conductive material may serve as signals paths for supplying current to conductive strands in actuators.

Magnetic-field-based actuators may be formed by coiling conductive strands around cylindrical support structures such as piping in a fabric-based item. The cylindrical support structure may initially have a non-circular cross-sectional shape such as an oval shape. When current is applied to a coiled conductive strand, the coiled conductive strand may assume a circular cross-sectional shape. The change in shape of the actuator due to the applied current may serve as haptic output for a user.

BRIEF DESCRIPTION OF THE DRAWINGS

FIGS. 5, 6, and 7 are cross-sectional side views of illustrative strands of material that may be used in forming an actuator in accordance with an embodiment.

FIG. 17 is a side view of an illustrative loop of wire in an actuator in accordance with an embodiment.

FIG. 18 is a side view of the loop of wire of FIG. 17 following application of current to the wire to change the shape of the wire in accordance with an embodiment.

DETAILED DESCRIPTION

It may be desirable to provide an electronic device or other item with actuators. Actuators may be used to provide tactile output to a user of a device. For example, haptic feedback may be provided to a user in connection with a key press event or a tactile alert may be generated.

Figure 1:
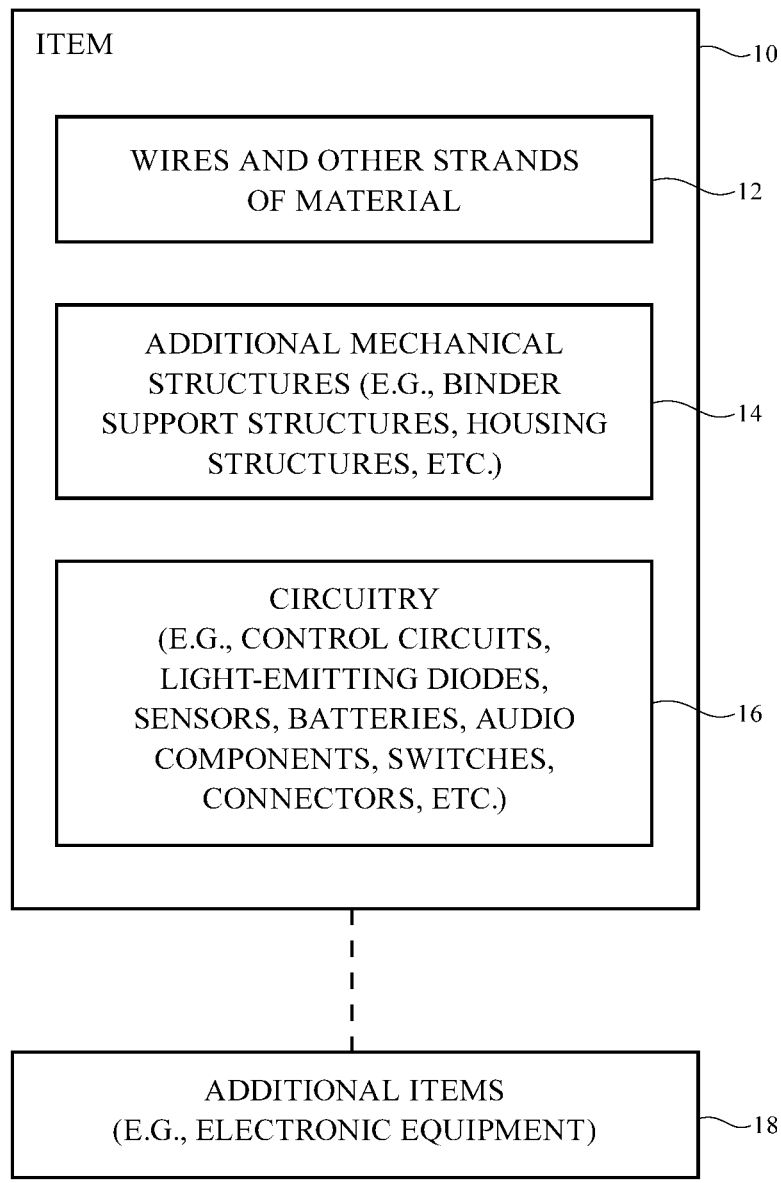
FIG. 1 is a schematic diagram of an illustrative item of the type that may be provided with one or more actuators in accordance with an embodiment.

An illustrative item of the type that may be provided with one or more actuators is shown in FIG. 1. Item 10 of FIG. 1 may be an electronic device or an accessory for an electronic device such as a laptop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which item 10 is mounted in a kiosk, in an automobile, airplane, or other vehicle, other electronic equipment, or equipment that implements the functionality of two or more of these devices. If desired, item 10 may be a removable external case for electronic equipment, may be a strap, may be a wrist band or head band, may be a removable cover for a device, may be a case or bag that has straps or that has other structures to receive and carry electronic equipment and other items, may be a necklace or arm band, may be a wallet, sleeve, pocket, or other structure into which electronic equipment or other items may be inserted, may be part of a chair, sofa, or other seating (e.g., cushions or other seating structures), may be part of an item of clothing or other wearable item (e.g., a hat, belt, wrist band, headband, shirt, pants, shoes, etc.), or may be any other suitable item with one or more actuators.

In some arrangements, item 10 may include intertwined strands of material 12 that form fabric. The strands of material in item 10, which may sometimes be referred to herein as yarns, may be single-filament strands (sometimes referred to as fibers or monofilaments) or may be strands of material formed by intertwining multiple monofilaments of material together. The strands of material may be formed from one or more layers of dielectric such as plastic, glass, etc. and/or one or more layers of conductive material such as metal, conductive polymer materials, polymer with sufficient embedded electrically conductive filler material to render the polymer conductive, graphene, or other conductive substances. Strands 12 that include metal may sometimes be referred to as wires.

Fabric formed from strands 12 may form all or part of a housing wall or other layer in an electronic device, may form internal structures in an electronic device, may form clothing, may form a strap, may form a wall for a bag or other enclosure, or may form other fabric-based structures. Item 10 may be soft (e.g., item 10 may have a fabric surface that yields to a light touch), may have a rigid feel (e.g., the surface of item 10 may be formed from a stiff fabric), may be coarse, may be smooth, may have ribs or other patterned textures, and/or may be formed as part of an item that has portions formed from non-fabric structures of plastic, metal, glass, crystalline materials, ceramics, or other materials.

Strands 12 may be formed from polymer, metal, glass, graphite, ceramic, natural materials such as cotton or bamboo, or other organic and/or inorganic materials and combinations of these materials. Conductive coatings such as metal coatings may be formed on non-conductive material. For example, plastic strands 12 in a fabric layer may be coated with metal to make them conductive. Reflective coatings such as metal coatings may be applied to make strands reflective. Strands may be formed from bare metal wires or metal wire intertwined with insulating monofilaments (as examples). Bare metal strands and strands of polymer covered with conductive coatings may be provided with insulating polymer jackets.

Strands 12 may be intertwined to form fabric using intertwining equipment such as weaving equipment, knitting equipment, or braiding equipment. Intertwined strands may, for example, form knitted fabric or woven fabric. Conductive strands and strands with insulating surfaces may be woven, knit, or otherwise intertwined to form conductive paths. The conductive paths may be used in forming signal paths (e.g., signal buses, power lines, control signal interconnects, etc.) and may be used in forming part of sensors (e.g., capacitive touch sensor electrodes, resistive touch sensor electrodes, etc.). To provide a user with tactile (haptic) output, conductive strands of material may be used in forming actuators. In general, conductive strands 12 in a fabric or other structure may be used in carrying power signals, digital signals, analog signals, sensor signals, control signals, data, input signals, output signals, or other suitable electrical signals.

Item 10 may include additional mechanical structures 14 such as polymer binder to hold strands 12 in a fabric or other structure together, support structures such as frame members, housing structures (e.g., an electronic device housing), and other mechanical structures.

To enhance mechanical robustness and electrical conductivity at strand-to-strand connections, additional structures and materials 14 (e.g., solder, crimped metal connections, welds, conductive adhesive such as anisotropic conductive film and other conductive adhesive, non-conductive adhesive, fasteners, etc.) may be used to help form strand-to-strand connections. These strand-to-strand connections may be formed where strands 12 cross each other perpendicularly or at other strand intersections where connections are desired. Insulating material can be interposed between intersecting conductive strands at locations in which it is not desired to form a strand-to-strand electrical connection. The insulating material may be plastic or other dielectric, may include an insulating strand or a conductive strand with an insulating coating, etc. Solder connections may be formed between conductive strands by melting solder so that the solder flows over conductive strands. The solder may be melted using an inductive soldering head to heat the solder, using a reflow oven to heat the solder, using a laser or hot bar to heat the solder, or using other soldering equipment. During soldering, outer dielectric coating layers (e.g., outer polymer layers) may be melted away in the presence of molten solder, thereby allowing underlying metal strands to be soldered together.

Item 10 may include circuitry 16. Circuitry 16 may include electrical components that are coupled to fabric or other structures formed from strands 12, electrical components that are housed within an enclosure that includes fabric or other structures formed from strands 12, electrical components that are attached to fabric formed from strands 12 using welds, solder joints, conductive adhesive bonds, crimped connections, or other electrical and/or mechanical bonds, and electrical components mounted in electronic device housings formed from plastic, glass, metal, fabric, and/or other materials. Circuitry 16 may include metal structures for carrying current, electrical devices such as integrated circuits, light-emitting diodes, sensors, and switches, and other electrical components. Circuitry 16 may include one or more actuators such as one or more actuators formed using conductive strands 12. The actuators may be aligned with respective electrical components in circuitry 16 and item 10. For example, each actuator in circuitry 16 may be aligned with a respective switch, sensor, or other input component. Control circuitry in circuitry 16 may be used to control the operation of item 10.

Item 10 may interact with electronic equipment or other additional items 18. Items 18 may be attached to item 10 or item 10 and item 18 may be separate items that are configured to operate with each other (e.g., when one item is a case and the other is a device that fits within the case, when one item is a wrist watch or pendant device and the other item is a strap for the item, etc.). Control circuitry in circuitry 16 may be used to support communications with item 18 and/or other devices. Circuitry 16 may include antennas and other structures for supporting wireless communications with item 18. Item 18 may also interact with item 10 using a wired communications link or other connection that allows information to be exchanged.

In some situations, item 18 may be an electronic device such as a cellular telephone, computer, or other portable electronic device and item 10 may form a cover (e.g., a cover including a keyboard and/or other buttons or a cover that does not include a keyboard), a case, a bag, an item of clothing, or other structure that receives the electronic device in a pocket, an interior cavity, or other portion of item 10. In other situations, item 18 may be a wristwatch device or other electronic device and item 10 may be a strap or other fabric-based item that is attached to item 18 (e.g., item 10 and item 18 may together form a fabric-based item such as a wristwatch with a strap). In still other situations, item 10 may be an electronic device, fabric 12 may be used in forming the electronic device, and additional items 18 may include accessories or other devices that interact with item 10. Signal paths formed from conductive strands may be used to route signals in item 10 and/or item(s) 18.

The fabric that makes up item 10 may be formed from multifilament and/or monofilament yarns that are intertwined using any suitable intertwining equipment (knitting equipment, weaving equipment, braiding equipment, equipment for forming felt, etc.). The fabric may be knitted, woven, braided, or otherwise formed from intertwined strands 12. Woven fabric may have a plain weave, a basket weave, a satin weave, a twill weave, or variations of these weaves, may be a three-dimensional woven fabric, or may be other suitable fabric. Knitted fabric may be weft knitted or warp knitted.

To provide tactile output to a user of item 10, item 10 may have one or more actuators. The actuators may be formed from one or more conductive strands of material. When current is applied to a conductive strand of material, the strand of material heats through ohmic heating. This cause the conductive strand to change shape and thereby create a force that is detectable by a user's fingertips or other body part. Current may be applied to the entire conductive strand of material (e.g., from a node at one end of the strand to a node at the other end of the strand) or may be applied to a segment of a conductive strand (e.g., between first and second nodes located at two different respective points along the length of the strand).

Figure 2:
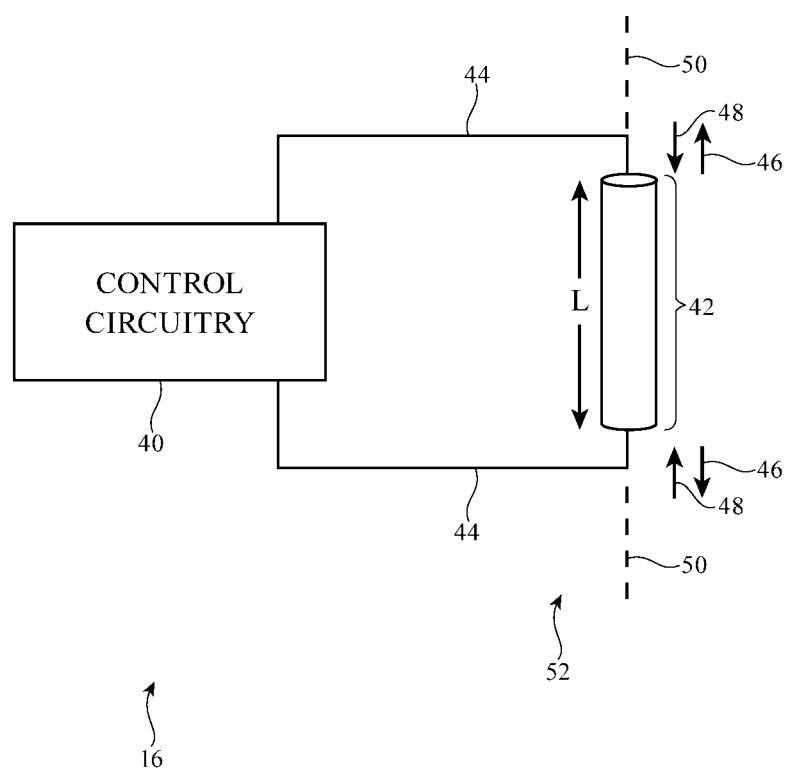
FIG. 2 is a diagram of an illustrative actuator and associated control circuitry in accordance with an embodiment.

As shown in FIG. 2, circuitry 16 of item 10 may include control circuitry 40. Control circuitry 40 may supply control signals to actuator 52 using conductive paths such as paths 44. Paths 44 may be formed from one or more conductive strands 12 and/or other conductive structures (e.g., conductive housing structures, metal plates, strips of metal foil, traces on printed circuits, metal brackets, etc.). Actuator 52 may have one or more conductive strands such as illustrative conductive strand 42 of FIG. 2. As shown in the example of FIG. 2, strand 42 may extend along longitudinal axis 50 and may have at least a portion of length L (i.e., strand 42 has opposing ends and is characterized by a length L extending between these ends or strand 42 represents a segment of length L within a longer strand extending along axis 50). Configurations in which strand 42 of actuator 52 is a stand-alone strand of length L may sometimes be described herein as an example, but, in general, actuator 52 may include one or more strands 42 of length L that are portions of larger strands of material. Strand 42 may be formed from a segment of material such as a wire or yarn formed from multiple monofilaments that have been intertwined together (as examples). Other configurations for strand 42 may be used, if desired.

Strand 42 may be formed from a material such as metal (e.g., an elemental metal such as platinum, an alloy such as nickel-chrome, etc.) or other conductive material. When current is applied to strand 42, ohmic heating will cause the temperature of strand 42 to rapidly rise. This will cause the material of strand 42 to expand due to thermal expansion effects (when the material of strand 42 has a positive coefficient of thermal expansion) or will cause the material of strand 42 to contract (when the material of strand 42 has a negative coefficient of thermal expansion). For example, assuming a positive coefficient of thermal expansion for strand 42, application of current to strand 42 by control circuitry 40 and paths 44 will cause the length L of strand 42 to increase in directions 46. Upon removing the applied current, air or other material surrounding strand 42 will cause strand 42 to cool and contract in directions 48 (i.e., length L may shrink). Changes in the length L of strand 42 along longitudinal axis 50 of strand 42 (i.e., elongations of strand 42) can be sensed by a user's finger or other body part that is in contact with strand 42. The rise in temperature of strand 42 and the subsequent cooling of strand 42 tend to be more difficult for a user to sense than the shear forces and other forces on the user's finger that are produced by changes in length L in directions 46 and 48. Accordingly, actuator 52 is generally effective at producing haptic output due to the ability of actuator 52 to produce dimensional changes such as length changes (i.e., longitudinal expansions and contractions in response to pulses of current).

Strand 42 may have any suitable size. As an example, length L of strand 42 (i.e., the length of the heated portion of a strand) may be 1-100 mm, may be 5-10 mm, may be 2-30 mm, may be more than 5 mm, more than 10 mm, less than 15 mm, less than 10 mm, or other suitable length. The diameter of strand 42 may be about 0.05 to 0.1 mm, 0.03 to 0.2 mm, more than 0.05 mm, more than 0.1 mm, less than 0.15 mm, or other suitable diameter. The conductive material that forms strand 42 may have a resistance of 1-3 ohm/cm, more than 0.5 ohm/cm, less than 5 ohm/cm, or other suitable value. Paths 44 may have a resistance that is less than the resistance of strand 42, so that strand 42 is heated rapidly without heating paths 44 or, if desired, paths 44 may have other resistance values.

Figure 3:
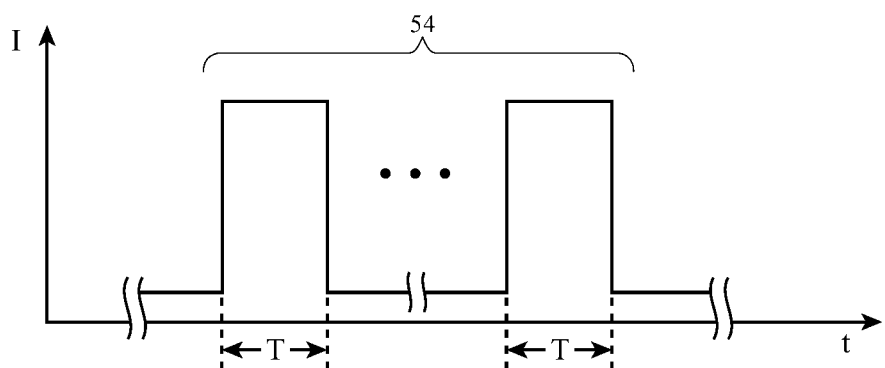
FIG. 3 is a diagram showing illustrative control signals that may be provided to an actuator in accordance with an embodiment.
Figure 4:
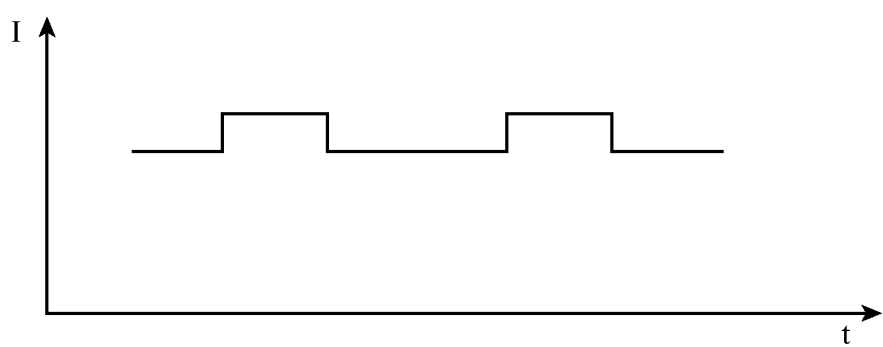
FIG. 4 is a diagram showing illustrative changes in the properties of an actuator such as actuator length in response to the control signal of FIG. 3 in accordance with an embodiment.

The control signal that control circuitry 40 applies to strand 42 may include one or more pulses 54 of current I of the type shown in FIG. 3 (e.g., pulses with a duration T of about 1-10 ms, more than 3 ms, less than 20 ms, or other suitable pulse width), resulting in noticeable changes in strand length L (i.e., elongation of the heated strand material) and/or strand diameter, as shown in FIG. 4.

As shown in the illustrative cross-sectional side view of strand 42 of FIG. 5, strand 42 may be formed from a solid conductive material (e.g., strand 42 may be formed from an elemental metal or a metal that is an alloy). FIG. 6 shows how strand 42 may have a coating layer such as coating 42-2 on a core such as core 42-1. Core 42-1 may be a metal or other conductive material and coating 42-2 may be a polymer or other dielectric or, if desired, core 42-1 may be a polymer or other dielectric and coating 42-2 may be a metal coating layer or other conductive coating layer. Configurations in which layers 42-1 and 42-2 are both metals or are both other conductive materials may also be used. In the illustrative configuration of FIG. 7, strand 42 has three portions: 42A, 42B, and 42C. Core 42A, which may be formed from metal or which may be formed from polymer or other dielectric, inner coating 42B, which may be formed from metal or which may be formed from polymer or other dielectric, and outer coating 42C, which may be formed from metal or which may be formed from polymer or other dielectric. Additional coating layers of polymer and/or metal may also be formed on the layers of strand 42 in FIG. 7. One or more, two or more, or three or more of the layers of material in strand 42 of FIG. 7 may be formed from a conductive material such as metal (elemental or alloy) so that current may pass through strand 42 during actuation of actuator 52.

Figure 8:
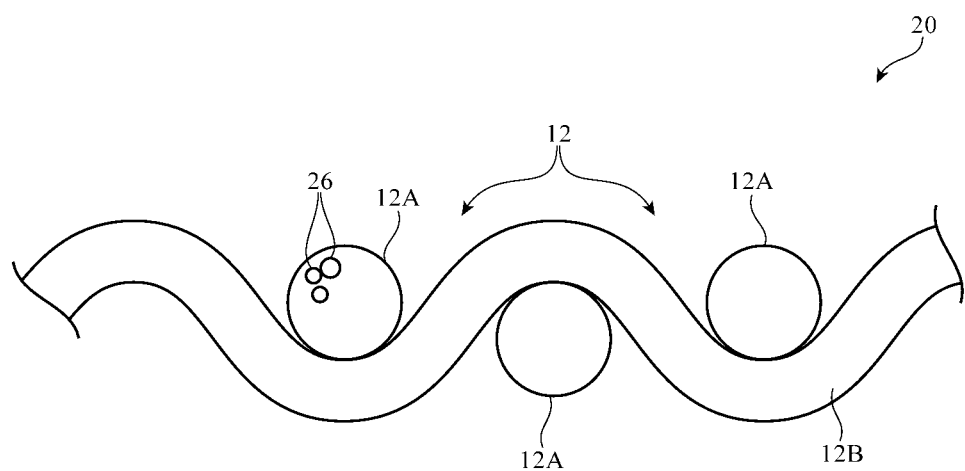
FIG. 8 is a cross-sectional side view of a layer of woven fabric in accordance with an embodiment.
Figure 9:
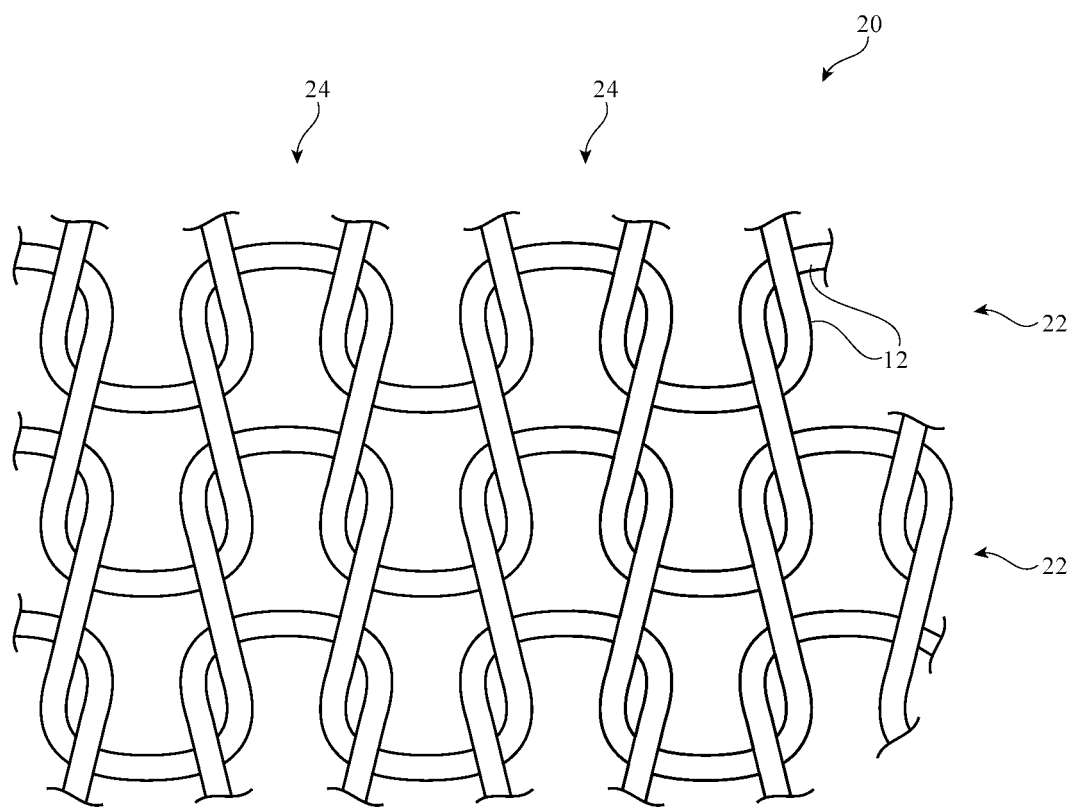
FIG. 9 is a top view of an illustrative layer of knit fabric in accordance with an embodiment.

FIG. 8 is a cross-sectional side view of an illustrative fabric. Fabric 20 of FIG. 8 is a woven fabric formed from strands 12. Strands 12 may include warp strands 12A and weft strands 12B. Each strand 12 may contain one or more monofilaments of material (see, e.g., illustrative monofilament strands 26). As shown in FIG. 9, fabric 20 may be a knit fabric. In the illustrative configuration of FIG. 9, fabric 20 has a single layer of knit strands 12 that form horizontally extending rows of interlocking loops (courses 22) and vertically extending wales 24. Other fabric constructions may be used for fabric 12 if desired.

Figure 10:
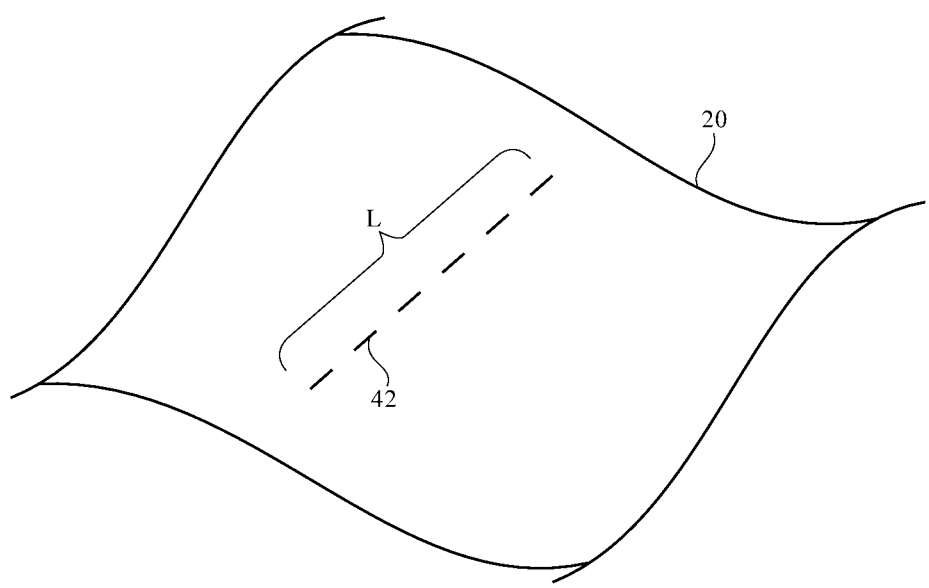
FIG. 10 is a perspective view of an illustrative layer of material into which a length of wire for an actuator has been incorporated in accordance with an embodiment.

Strands of material for actuator 52 such as illustrative strand 42 of FIG. 7 may be incorporated into fabric 20 (e.g., by weaving one or more strands such as strand 42 into fabric 20 as a warp or weft strand in place of one of the warp or weft strands 12 of FIG. 8 or by knitting one or more strands such as strand 42 into fabric 20 in place of one of strands 12 of FIG. 9). Strands of material such as illustrative strand 42 may also be incorporated into fabric 20 by sewing or other techniques. As shown in FIG. 10, for example, strand (strand segment) 42 of length L may be sewn into layer 20 or otherwise incorporated into layer 20. Layer 20 of FIG. 10 may be a layer of fabric and/or one or more other layers of material such as plastic, leather, metal foil, etc.

Figure 11:
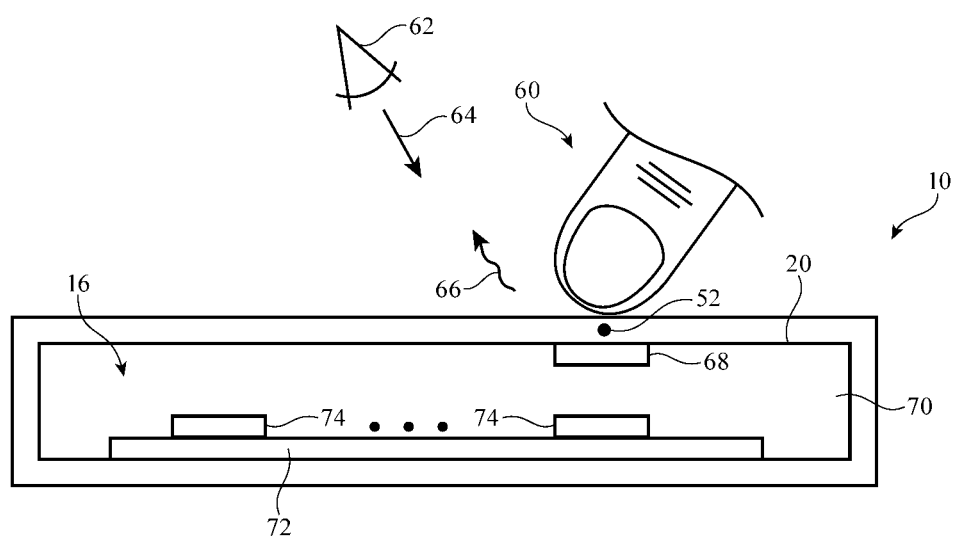
FIG. 11 is a cross-sectional side view of an illustrative item with an actuator and other circuitry in accordance with an embodiment.

FIG. 11 is a cross-sectional side view of item 10 in an illustrative configuration in which item 10 includes layer(s) of material such as fabric 20 that form walls for item 10 or other portions of item 10 (e.g., straps, handles, pockets, etc.). Item 10 may include circuitry 16. Circuitry 16 may include components in interior 70 of item 10 such as electrical components 74. Components 74 may be mounted on one or more substrates such as printed circuit board 72 and/or may be soldered, crimped, welded, or otherwise attached to conductive strands 12 in fabric 20. Printed circuit board 72 may be a rigid printed circuit board (e.g., a printed circuit board formed from rigid printed circuit board substrate material such as fiberglass-filled epoxy) or may be a flexible printed circuit (e.g., a printed circuit formed from a sheet of polyimide or other flexible polymer substrate material). Components 74 may include integrated circuits and other components.

One or more actuators may be incorporated into item 10. In the example of FIG. 11, actuator 52 is incorporated into a portion of fabric 20 in a location that can be touched by a user's finger (see, e.g., finger 60). This location may overlap a component such as component 68 of circuitry 16 (i.e., actuator 52 may be aligned with component 68). Component 68 may be mounted to printed circuit 72 or may be coupled to cables or other signal paths in item 10. Components such as component 68 may include light-emitting components, may include input devices such as switches (e.g., a switch for a keyboard key or a switch for a stand-alone button, capacitive sensors that serve as touch sensors or capacitive buttons, force sensors such as force sensors based on strain gauges or other structures, light-based input devices such as light-based touch sensors or light-based proximity sensors, other input devices, or other suitable electrical devices). As shown in FIG. 11, component 68 or a light-emitting diode associated with component 68 may emit light 66 that is visible to a user such as viewer 62 who is viewing item 10 in direction 64. Because actuator 52 is aligned with component 68, actuator 52 can provide tactile output to finger 60 when finger 60 is adjacent to component 68 (e.g., when finger 60 is supplying input to an input device). Other types of arrangement may be used for item 10 if desired. The arrangement of FIG. 11 in which components such as component 68 are aligned with actuators 52 is merely an example.

With one illustrative configuration for item 10, components such as component 68 may be used to form a keyboard with illuminated keys. For example, item 10 may be a cover for a tablet computer or other device that includes a keyboard and each component 68 may include a dome switch or other switch for a respective keyboard key in the keyboard. With this arrangement, each component 68 may be associated with a light-emitting diode or other light-emitting structure that emits light 66 in a trim pattern for the keyboard key and/or in the shape of a symbol that serves as a label for the key.

During operation, a user may place fingers on the keyboard such as illustrative finger 60 of FIG. 11 and may push downwards on the keyboard (item 10 in this example). The downward pressure from finger 60 may close the dome switch or may activate the capacitive sensor device, force sensor device, light-based sensor, or other component 68 that senses user key press activity. To provide the user with tactile feedback (sometimes referred to as haptic feedback), control circuitry 40 (FIG. 2) of circuitry 16 may actuate actuator 52 in response to detection of the closing of the dome switch or other input device state change indicating detection of a key press event. Circuitry 40 may, for example, supply one or more current pulses to a conductive strand. As control circuitry 40 supplies one or more current pulses to strand 42 of actuator 52, actuator 52 will change shape and this physical change in the state of actuator 52 will be detected by the user at finger 60 as a shear force or other physical force. The use of haptic feedback in this way may provide the user with confirmation that the user successfully pressed a desired key. In general, any type of force sensor, capacitive touch sensor, light-based sensor, switch, or other user input device may be provided with haptic feedback structures based on one or more of actuators 52. The use of actuator 52 to provide a fabric keyboard key with haptic feedback is merely illustrative.

Figure 12:
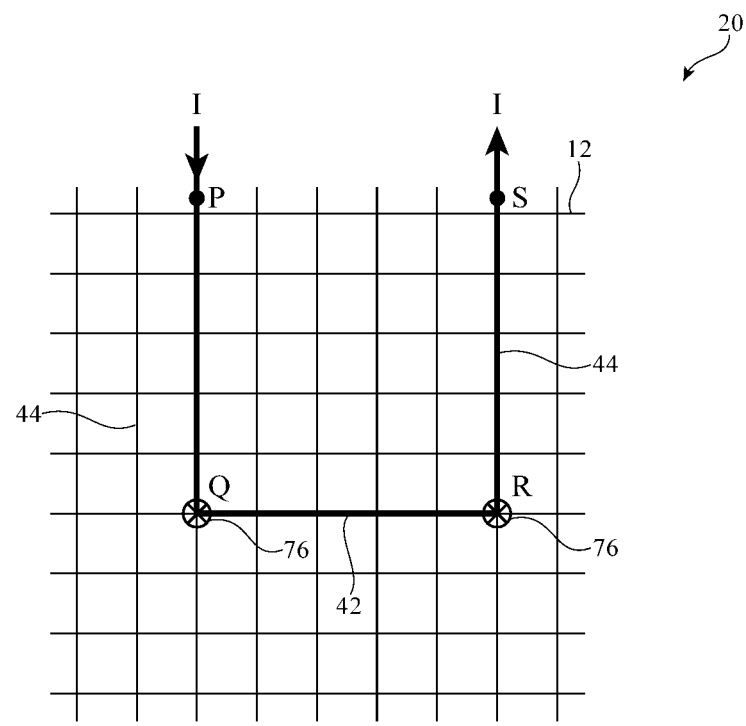
FIGS. 12 and 13 are top views of illustrative woven fabric layers having signal paths for providing control signals to actuators in accordance with embodiments.

FIG. 12 is a top view of a portion of a fabric layer in which strand 42 of actuator 52 has been coupled to conductive strands 44 in a fabric made up of other strands 12 (e.g., insulating strands). Strands 44 may be formed from metal that is more conductive than the metal of strand 42 (as an example). At connection points such as connections 76, solder, welds, crimped connections, or other connection structures may be used to join and electrically short strands 44 to strand 42, which may be a stand-alone length of material or which may be a segment of a longer strand. During operation of actuator 52, current may be applied to strand 42 from control circuitry 40 (FIG. 2) using strands 44 and connections 76. Because strands 44 are more conductive per unit length than strand 42 (in this example), there will be less heating in strands 44 (e.g., between nodes P and Q and between nodes R and S) than in strand 42 between nodes Q and R.

Figure 13:
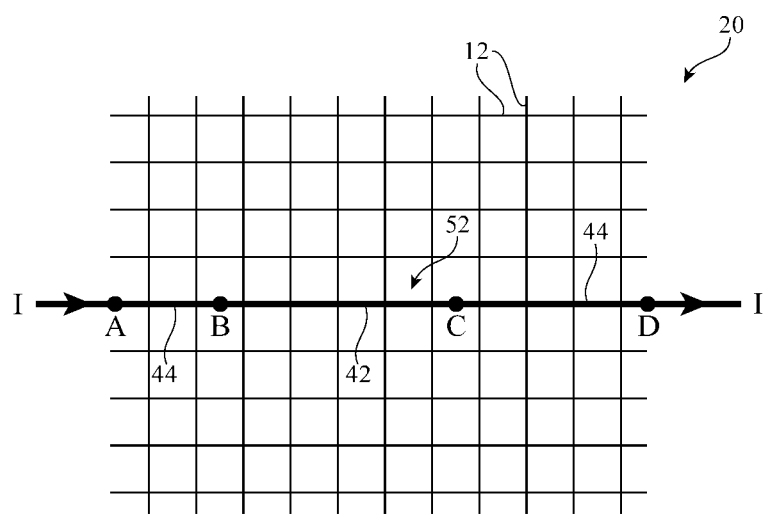

If desired, strands 44 may be collinear with strand 42 (i.e., strand 42 may be a resistive segment of conductive material within a longer strand formed up of less resistive conductive material), as shown in illustrative fabric 20 of FIG. 13. In this type of arrangement, there will be less ohmic heating in strands 44 between nodes A and B and between nodes C and D than in strand 42 between nodes B and C due to the lower resistance per unit length of strands 44 than strand 42.

Figure 14:
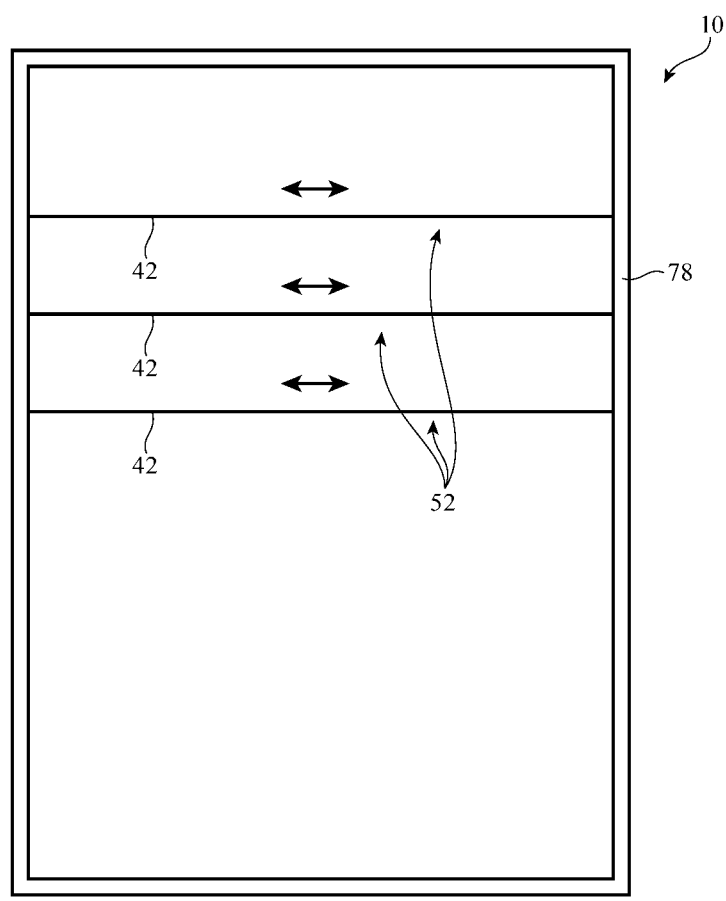
FIG. 14 is a top view of an illustrative electronic device having lengths of wire that serve as actuators in accordance with an embodiment.

In the illustrative configuration of item 10 shown in the top view of FIG. 14, item 10 is an electronic device having electronic device housing 78. Housing 78 may be formed form metal, plastic, glass, ceramic, fiber-composite materials, and/or other materials. Strands 42 may be coupled to different locations on housing 78 (e.g., strands 42 may be coupled to housing 78 directly or may be coupled to housing 78 indirectly through structures that are coupled to housing 78). When current is passed through strands 42, the change in length of strands 42 will cause housing 78 to vibrate or otherwise move and provide haptic output for item 10 (i.e., strands 42 will serve as actuators 52). Strands 42 may lengthen or may contract in response to applied current, depending on whether strands 42 exhibit a positive or negative coefficient of thermal expansion.

If desired, actuators 52 may be arranged in rows, in columns, in other linear one-dimensional arrays, in curved strips, in two-dimensional arrays with rectangular outlines, in arrays with circular outlines, in arrays having shapes with curved and/or straight edges, or in other arrangements on the surface of a fabric in item 10 and/or elsewhere in item 10. Actuators 52 may be activated in patterns by control circuitry 40. Different patterns may be used in different contexts. For example, control circuitry 40 may direct actuators 52 to produce a first pattern of haptic output in response to satisfaction of a first set of operating conditions and to produce a second pattern of haptic output in response to satisfaction of a second set of operating conditions.

Item 10 may include a series of actuators 52 that extend along a given dimension in item 10 (e.g., in a row along the surface of a fabric, etc.). With this type of arrangement, each actuator 52 may be momentarily actuated in sequence to create a wave-like haptic effect. Actuators 52 may, for example, be operated in sequence to generate a wave of fabric displacement that passes from left-to-right across item 10. Actuators 52 may also be synchronized so as to generate a wave that moves in other directions, may be used to generate oscillating output at a given position (e.g., pulses of displacement in a stationary location), or may create haptic output in other patterns across the surface of item 10. Control circuitry 40 may create timed pulses of current to produce effects such as these or other haptic output patterns.

Figure 15:
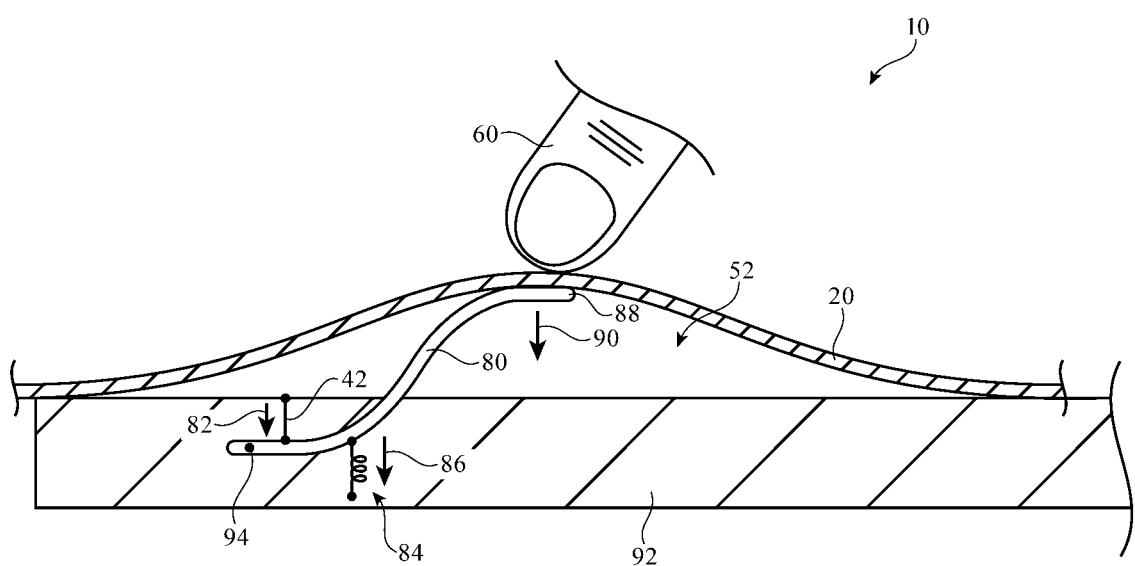
FIG. 15 is a cross-sectional side view of an illustrative actuator having a moving member that is controlled by a wire actuator in accordance with an embodiment.

FIG. 15 is a cross-sectional side view of actuator 52 in an illustrative configuration in which strand 42 is attached to a movable member such as member 80 to provide actuator 52 with mechanical advantage (i.e., to provide leverage). Strand 42 may have one end coupled to support structure 92 and another end coupled to member 80. Member 80 may pivot about hinge 94. Tip 88 of member 80 may be covered with fabric 20 or other covering structures. A user's finger such as finger 60 may touch tip 88 of member 80 through fabric 20 and may thereby sense whether actuator 52 is active (i.e., whether tip 88 is moving). When no current is applied to strand 42 by control circuitry 40 (FIG. 2), strand 42 has a constant length and spring 84 may bias member 80 downwards in direction 86 until strand 42 has reached its maximum room temperature length, thereby preventing further downward movement of member 80. In this configuration, member 80 and tip 88 do not move and the user's finger 60 will not sense any movement in tip 88 of actuator 52. When current is applied to strand 42 by control circuitry 40, strand 42 may increase in length due to the rise in temperature of strand 42 from ohmic heating. This allows spring 84 to pull member 80 farther downwards in direction 86.

Due to the position of strand 42 near pivot 82 and the relatively long length of member 80 between pivot 82 and tip 88, small changes in the length of strand 42 will give rise to relatively larger changes in the position of tip 88. In particular, tip 88 may move downwards in direction 90 by more than the increase in length of strand 42. This causes finger 60 to experience enhance movement in actuator 52. If desired, other types of lever arm structures may be used to provide actuator 52 with mechanical advantage to amplify the vibrational output (or other movement) of actuator 52 in response to application of a given amount of current to strand 42. The configuration of FIG. 15 is merely illustrative. Actuator 52 may form part of a keyboard key in a fabric-based item such as a fabric cover for a tablet computer, may form part of an electronic device housing (e.g., a portion of a housing associated with a button for which it is desired to provide haptic feedback), or may be formed as part of other items (e.g., fabric based items such as straps for watches, handles for bags, clothing, etc.), or may be used in any other suitable item.

Figure 16:
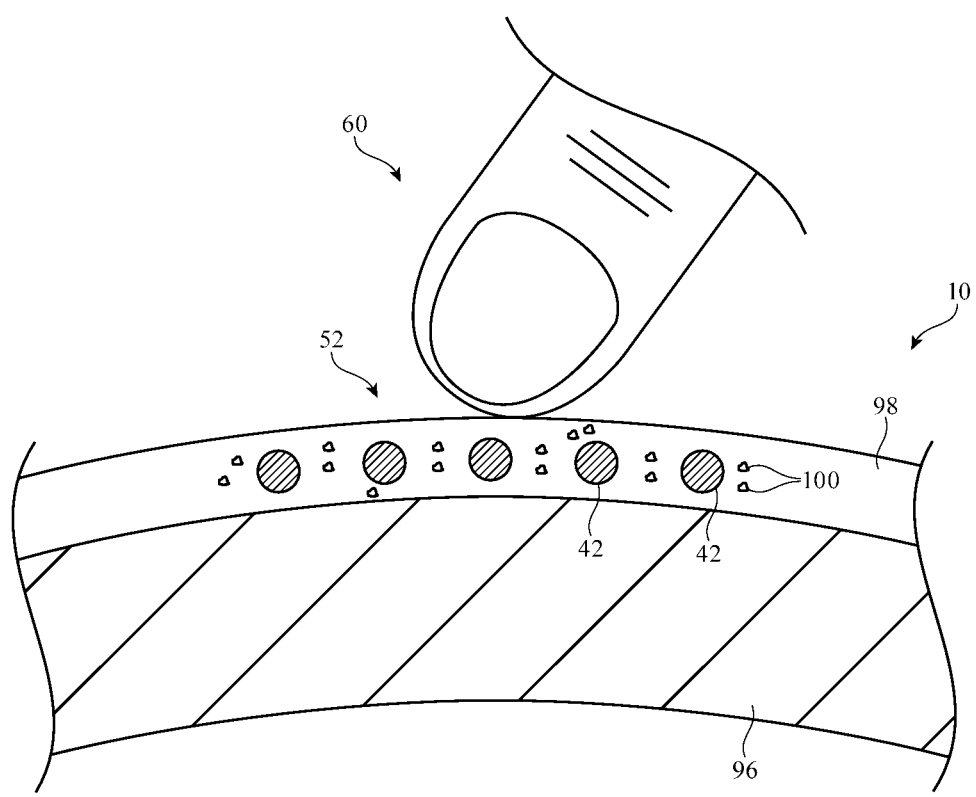
FIG. 16 is a cross-sectional side view of an illustrative actuator having wires embedded in a layer of material in accordance with an embodiment.

In the example of FIG. 16, item 10 includes a coating layer such as layer 98 on a structure such as support structure 96. Support structure 96 may form part of a fabric-based item (e.g., structure 96 may be formed from a layer of fabric 20) or may be an electronic device housing structure or other suitable supporting structure. Coating layer 98 may be formed from a layer of dielectric such as a polymer or other material that contains embedded filler structures such as particles 100. One or more strands such as strands 42 may be embedded within layer 98. The polymer or other dielectric material of layer 98 may help electrically insulate strands 42 and/or may help protect strands 42 from damage. Layer 98 may be formed from an elastomeric material (e.g., silicone) to allow strands 42 to stretch and create shear forces that are detectable by finger 60. Filler 100 may include particles or fibers with high thermal conductivity (e.g., graphite, metal, etc.) to help enhance the thermal conductivity of layer 98. This may help strands 42 to rapidly cool after each pulse of current is applied to strands 42. Structure 96 (e.g., a metal structure) may also serve as a heat sink that helps remove heat from strands 42.

In some arrangements, conductive strands 12 may be arranged in a loop shape and may operate by creating magnetic fields that move the conductive strands. Initially, actuator 52 may have a strand such as strand 102 of FIG. 17 that has a non-circular shape such as an oval shape. When current is applied to a loop-shaped strand such as strand 102 of FIG. 17, magnetic field B builds up within the interior of the loop. In the presence of magnetic field B within the interior of the loop, the shape of the loop tends to become circular to minimize potential energy in the system, as shown in FIG. 18. The change in shape of strand 102 from the oval (non-circular) coil shape of FIG. 17 to the circular coil shape of FIG. 18 and the movement of strand 102 that results from this change of shape is detectable by a user's finger (see, e.g., finger 60 of FIG. 18). Because actuator 52 of FIGS. 17 and 18 operates by producing magnetic fields B, actuators such as actuator 52 of FIGS. 17 and 18 may sometimes be referred to as magnetic-field-based actuators or coiled strand actuators.

Figure 19:
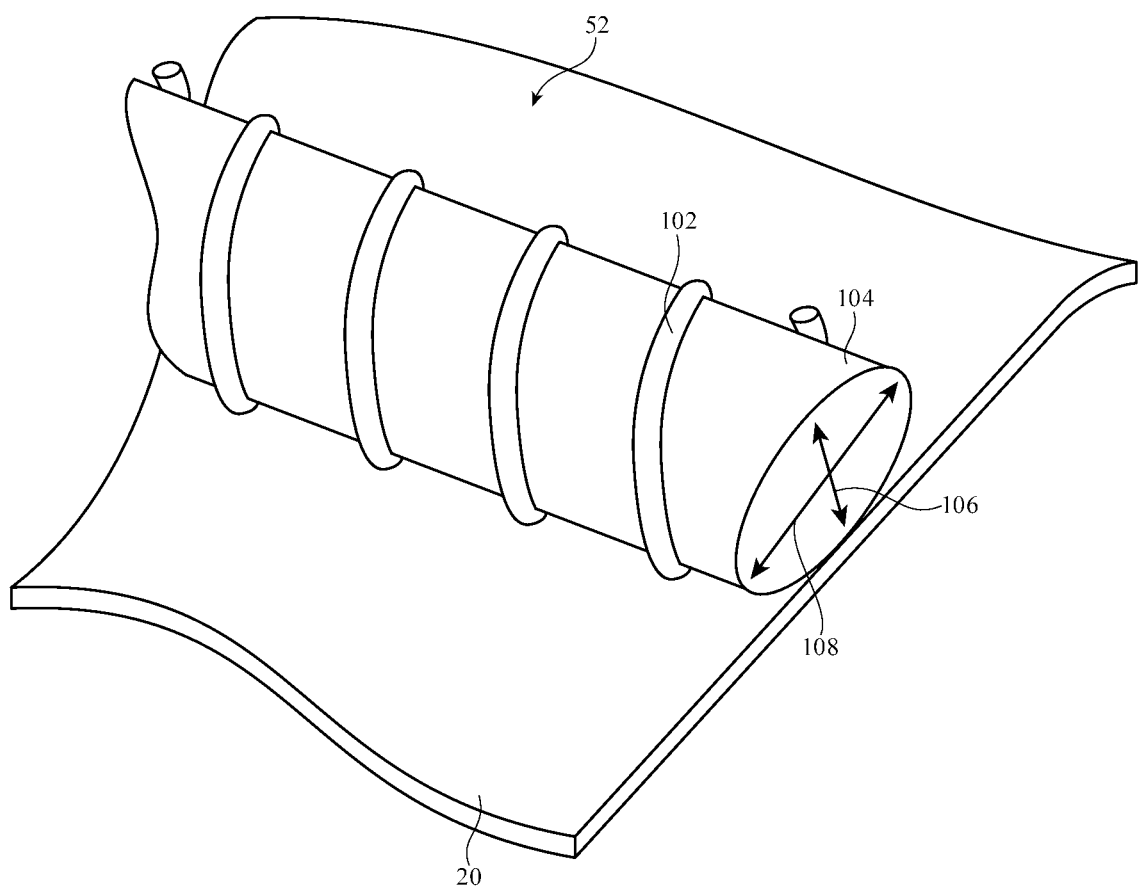
FIG. 19 is a perspective view of an oval tube structure such as a length of piping on a fabric layer with an actuator formed from a coiled wire in accordance with an embodiment.

If desired, a coiled strand actuator may be formed by coiling strand 102 around a tubular structure such as tubular support structure 104 of FIG. 19. Tubular support structure 104 may be a fabric structure such as a length of fabric piping and may, if desired, be attached to fabric 20 (e.g., to serve as trim on fabric 20 in item 10). In general, tubular structure (tube) 104 may be formed from any suitable materials (foam, fabric, elastomeric polymer, or other materials). Tubular structure 104 may initially have an oval profile (e.g., a cross-sectional shape that is characterized by a minor axis 106 and larger major axis 108) or other non-circular profile. When current is applied to strand 102, the non-circular cross-sectional shape of structure 104 will tend to change to a circular cross-sectional shape, as described in connection with actuator 52 of FIGS. 17 and 18. This will create movement in tubular structure 104 that can be detected by a user's finger or other body part that is touching tubular structure 104 (i.e., tubular structure 104 and coiled strand 102 will form actuator 52).

Figure 20:
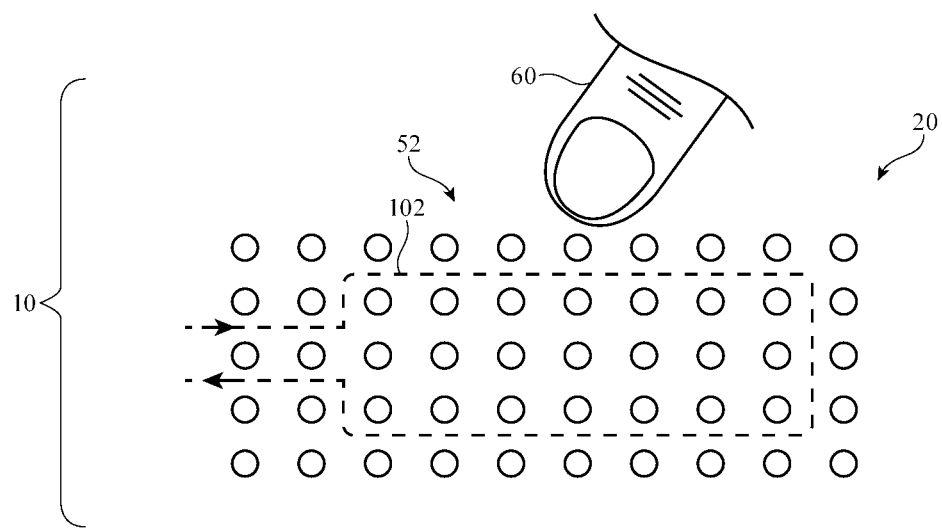
FIGS. 20 and 21 are cross-sectional side views of illustrative multilayer fabric layers having wires for actuators in accordance with embodiments.
Figure 21:
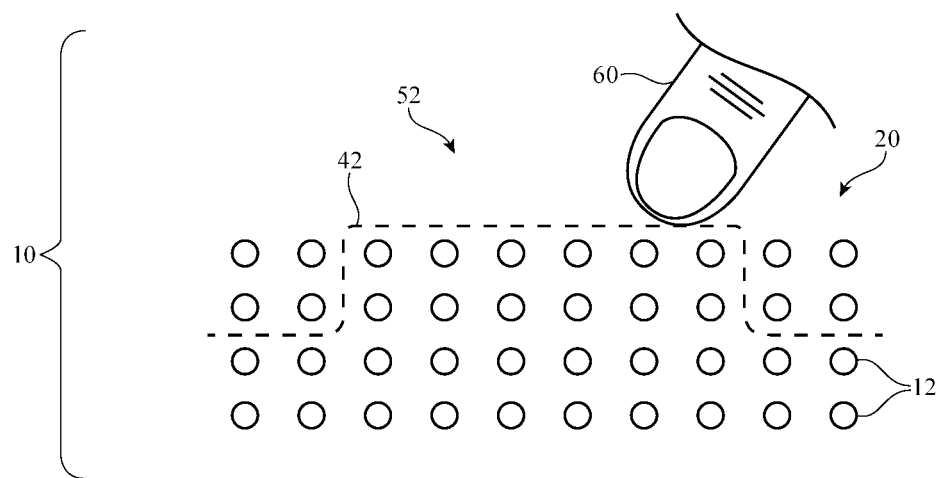

FIGS. 20 and 21 are cross-sectional side views of fabric 20 having multiple layers. Strands such as strand 102 may be woven, knit, sewn, or otherwise incorporated into the layers of fabric 20 in the shape of a loop or set of loops, as shown in FIG. 20. This loop shape may allow strand 102 to form a magnetic-field-based actuator structure for actuator 52. A user's finger such as finger 60 may detect movement in actuator 52 through fabric 20.

Strands such as strand 42 of FIG. 21 may be incorporated into fabric 20 to form an actuator pad for actuator 52. There may be one or more parallel strands 42 on the surface of fabric 20 (e.g., to form a rectangular pad in the shape of a keyboard key or to form multi-strand actuator pads of other suitable shapes). During operation, strands 42 may be contacted on the surface of fabric 20 in item 10 by user's finger 60.

Actuators such as actuators 52 of FIGS. 20 and 21 may be incorporated into the surface of item 10, into a strap for item 10, into a handle or pocket for item 10, into a planar fabric cover layer for a keyboard in item 10, and/or into any other structure for forming item 10.

The foregoing is merely illustrative and various modifications can be made by those skilled in the art without departing from the scope and spirit of the described embodiments. The foregoing embodiments may be implemented individually or in any combination.

What is claimed is:

1. A fabric-based item comprising:
   fabric formed from strands of material;
   an actuator formed from a conductive strand, wherein the actuator is coupled to the fabric and wherein the actuator provides haptic output; and
   a control circuit that supplies a signal to the conductive strand that elongates the conductive strand.

2. The fabric-based item defined in claim 1 wherein the conductive strand comprises metal.

3. The fabric-based item defined in claim 1 wherein the fabric comprises woven fabric.

4. The fabric-based item defined in claim 1 wherein the fabric comprises knitted fabric.

5. The fabric-based item defined in claim 1 further comprising an electrical component that is aligned with the actuator.

6. The fabric-based item defined in claim 5 wherein the electrical component comprises a sensor.

7. The fabric-based item defined in claim 5 wherein the electrical component comprises a switch.

8. The fabric-based item defined in claim 1 further comprising a keyboard having keys covered with the fabric, wherein the actuator is aligned with one of the keys.

9. The fabric-based item defined in claim 1 further comprising an electronic device housing, wherein the strand of conductive material is coupled to the electronic device housing.

10. The fabric-based item defined in claim 1 wherein the strands of material in the fabric include at least first and second wires that are coupled respectively to first and second locations on the conductive strand in the actuator.

11. The fabric-based item defined in claim 1 wherein the conductive strand is woven with the strands of material to form the fabric.

12. The fabric-based item defined in claim 1 wherein the conductive strand is knitted with the strands of material to form the fabric.

13. The fabric-based item defined in claim 1 wherein the conductive strand is sewn to the fabric.

14. The fabric-based item defined in claim 1 further comprising a movable member coupled to the conductive strand that is moved by the conductive strand when the length changes.

15. A fabric-based item comprising:
    fabric formed from strands of material;
    an actuator formed from a conductive strand, wherein the actuator is coupled to the fabric and wherein the fabric and the conductive strand overlap an input device; and
    a control circuit that provides haptic output associated with the input device by applying current to the conductive strand that causes the conductive strand to thermally expand and elongate.

16. The fabric-based item defined in claim 15 wherein the fabric comprises woven fabric and wherein the conductive strand is a conductive strand selected from the group consisting of: a conductive weft strand and a conductive warp strand.

17. The fabric-based item defined in claim 16 wherein the input device comprises a device selected from the group consisting of: a switch, a force sensor, a capacitive sensor, and a light-based sensor.

18. The fabric-based item defined in claim 17 wherein the input device gathers input from a user and wherein the control circuit applies the current in response to input gathered with the input device.

19. The fabric-based item defined in claim 15 wherein the fabric has multiple layers and wherein the conductive strand extends through at least some of the multiple layers.

20. The fabric-based item defined in claim 15 further comprising additional conductive strands to which the control circuit applies current, wherein the control circuit applies the current to the conductive strand and the additional conductive strands to generate a pattern of haptic output across the fabric.

21. The fabric-based item defined in claim 20 wherein the conductive strand and the additional conductive strands are arranged across a surface of the fabric so that the pattern of haptic output forms a wave of fabric displacement across the fabric.

22. A fabric-based item comprising:
    fabric formed from strands of material;
    an actuator formed from a conductive strand, wherein the actuator is coupled to the fabric;
    a control circuit that supplies a signal to the conductive strand that elongates the conductive strand; and
    a movable member coupled to the conductive strand that is moved by the conductive strand when the length changes.

23. The fabric-based item defined in claim 22, comprising:
    a magnetic-field-based actuator formed from an additional conductive strand that is coiled around a tubular structure with a non-circular cross-sectional shape, wherein the control circuit applies current to the additional conductive strand to generate a magnetic field that changes the tubular structure from the non-circular cross-sectional shape to a circular cross-sectional shape.

24. The fabric-based item defined in claim 23, wherein the tubular structure comprises piping on the fabric.

\* \* \* \* \*